(12) United States Patent
Gruenhagen et al.

(10) Patent No.: US 8,058,732 B2
(45) Date of Patent: Nov. 15, 2011

(54) SEMICONDUCTOR DIE STRUCTURES FOR WAFER-LEVEL CHIPSCALE PACKAGING OF POWER DEVICES, PACKAGES AND SYSTEMS FOR USING THE SAME, AND METHODS OF MAKING THE SAME

(75) Inventors: Michael D. Gruenhagen, Salt Lake City, UT (US); Suku Kim, South Jordan, UT (US); James J. Murphy, South Jordan, UT (US); Ihsiu Ho, Salt Lake City, UT (US); Eddy Tjhia, Sunnyvale, CA (US); Chung-Lin Wu, San Jose, CA (US); Mark Larsen, Sandy, UT (US); Rohit Dikshit, Herriman, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 380 days.

(21) Appl. No.: 12/275,086

(22) Filed: Nov. 20, 2008

(65) Prior Publication Data
US 2010/0123225 A1    May 20, 2010

(51) Int. Cl.
*H01L 23/48* (2006.01)
(52) U.S. Cl. . 257/774; 257/773; 257/698; 257/E25.017; 257/E23.145; 257/E21.549; 257/E21.577; 257/E21.585
(58) Field of Classification Search .................. 257/678, 257/698, 773, 774, E25.017, E23.145, E21.549, 257/E21.577, E21.585
See application file for complete search history.

(56) References Cited

U.S. PATENT DOCUMENTS

| | | | |
|---|---|---|---|
| 6,033,489 A | 3/2000 | Marchant et al. | |
| 6,104,062 A | 8/2000 | Zeng | |
| 6,373,100 B1 | 4/2002 | Pages et al. | |
| 6,392,290 B1 | 5/2002 | Kasem et al. | |
| 6,653,740 B2 | 11/2003 | Kinzer et al. | |
| 6,858,471 B1 | 2/2005 | Korec et al. | |
| 7,227,242 B1 | 6/2007 | Lin et al. | |
| 7,834,461 B2 * | 11/2010 | Asai et al. | 257/774 |
| 2004/0188837 A1 | 9/2004 | Kim et al. | |
| 2006/0226451 A1 | 10/2006 | Davies | |
| 2006/0226498 A1 | 10/2006 | Davies | |
| 2006/0252225 A1 | 11/2006 | Gambee et al. | |
| 2006/0264029 A1 | 11/2006 | Heck et al. | |
| 2007/0045779 A1 | 3/2007 | Hiatt | |
| 2007/0090434 A1 | 4/2007 | Davies et al. | |
| 2008/0054483 A1 | 3/2008 | Lee et al. | |

OTHER PUBLICATIONS

International Search Report and Written Opinion of the International Searching Authority for PCT Application No. PCT/US2009/061879, mailed Jun. 1, 2010, 10 pages.

* cited by examiner

*Primary Examiner* — Jasmine Clark
(74) *Attorney, Agent, or Firm* — Kilpatrick Townsend & Stockton LLP

(57) ABSTRACT

Disclosed are semiconductor die structures that enable a die having a vertical power device to be packaged in a wafer-level chip scale package where the current-conducting terminals are present at one surface of the die, and where the device has very low on-state resistance. In an exemplary embodiment, a trench and an aperture are formed in a backside of a die, with the aperture contacting a conductive region at the top surface of the die. A conductive layer and/or a conductive body may be disposed on the trench and aperture to electrically couple the backside current-conducting electrode of the device to the conductive region. Also disclosed are packages and systems using a die with a die structure according to the invention, and methods of making dice with a die structure according to the invention.

33 Claims, 3 Drawing Sheets

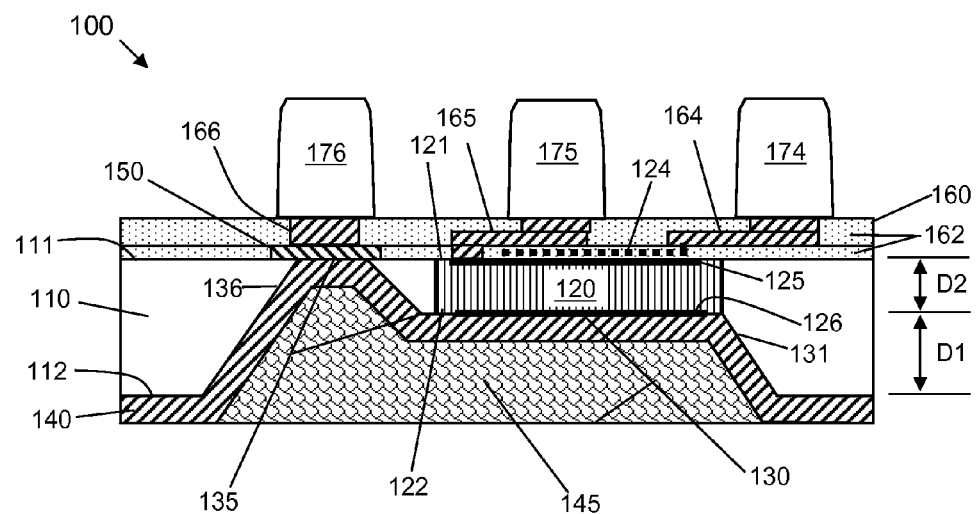
FIG. 1
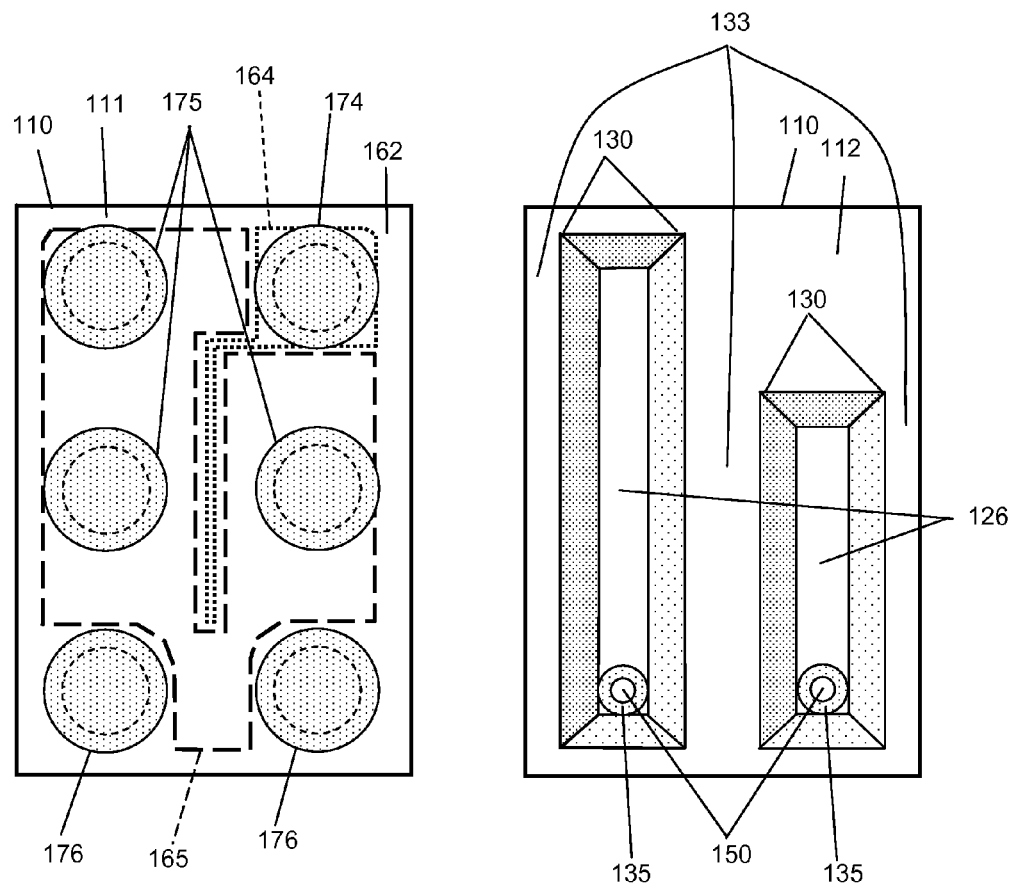
FIG. 2         FIG. 3

SEMICONDUCTOR DIE STRUCTURES FOR WAFER-LEVEL CHIPSCALE PACKAGING OF POWER DEVICES, PACKAGES AND SYSTEMS FOR USING THE SAME, AND METHODS OF MAKING THE SAME

CROSS-REFERENCES TO RELATED APPLICATIONS

NOT APPLICABLE

BACKGROUND OF THE INVENTION

Currently, power semiconductor devices are packaged in leadframe packages that are relatively large and that include complex arrangements to handle the large currents and heat dissipation in the devices. These devices have a control terminal and a first current-conducting terminal on one surface of the die, and a second current-conducting terminal on the other surface of the die. The control terminal and the first current-conducting terminal are electrically coupled to the leadframe, such as by flip-chip bonding. The leadframe and package are encased by an electrically insulating material. The second current-conducting terminal may be metallized and left bare by the package for electrically coupling to a substrate, or, in more complex arrangements, may be electrically coupled to the leadframe by a die clip.

BRIEF SUMMARY OF THE INVENTION

As part of making their invention, the inventors recognize that the size, complexity, and cost of a power semiconductor device could be substantially reduced if the power die could be packaged in a wafer-level chip scale package, where both of the first and second current-conducting terminals are present at one surface of the die. However, such a configuration would result in unacceptably high on-state resistance for the device. Contrary to the prior art, the present invention enables power semiconductor devices to be packaged in wafer-level chip scale packages with low on-state resistance.

Accordingly, a first general exemplary embodiment according to the present invention is directed to a semiconductor die comprising a first surface and a second surface opposite to the first surface; a conductive region disposed at the first surface of the semiconductor die; a trench disposed at the second surface of the semiconductor die, the trench having a surface that is spaced from the first surface by at least a first distance; an aperture disposed in the semiconductor die and extending from at least a portion of the trench to the conductive region, the aperture having a surface and exposing a backside portion of the conductive region; and a conductive member disposed on at least a portion of the trench's surface, at least a portion of the aperture's surface, and the backside portion of the conductive region. The conductive member may comprise a conductive layer, a body of conductive material, or a combination thereof. A power semiconductor device region may be disposed between the first surface of the die and the trench, with a first current-conducting electrode disposed adjacent to the first surface and a second current-conducting electrode disposed adjacent to the trench, with the second current-conducting electrode being electrically coupled to the conductive region at the die's first surface by way of the conductive member.

With this exemplary construction, a power semiconductor device disposed in the semiconductor die may have both of its current-conducting terminals disposed at the first surface of the semiconductor die, thereby enabling the power semiconductor die to be incorporated into a wafer-level chip scale package. Such a package enables the die to be attached face down to an interconnect substrate using conventional surface-mount technology, with the die's interconnect pads connected directly (without any interposer) to the interconnect substrate with solder balls, or the like. No underfill encapsulation material is needed. In addition, the trench, aperture, and conductive member provide a lower resistance current path from the second electrode of the semiconductor device region to the conductive region at the die's first surface (i.e., the second current-conducting terminal), thereby enabling the device to have a low on-state resistance while having a form that is compatible with a wafer-level chip scale package.

A second general exemplary embodiment according to the present invention is directed to a method of making a semiconductor die. The method comprises forming a conductive region at a first surface of a semiconductor die adjacent to a semiconductor device region, the semiconductor device region extending from the first surface of the semiconductor die to a second surface of the semiconductor die, the second surface being opposite to the first surface. The semiconductor device region has a first electrode closer to the first surface than the second surface, and a second electrode disposed between the first electrode and the second surface. The method further comprises forming at least one trench at the second surface of the semiconductor die, the trench extending toward the conductive region and the second electrode of the semiconductor device region; and forming at least one aperture in the semiconductor die, the at least one aperture extending from a portion of the at least one trench to the conductive region. The method further comprises disposing an electrically conductive member to cover at least a portion of the trench's surface, at least a portion of the aperture's surface, and the backside portion of the conductive region. The latter action may comprise forming a layer of conductive material over the surfaces of the at least one trench and the at least one aperture, disposing a body of electrically conductive material on the at least one trench, the at least one aperture, and the conductive region, or a combination thereof. The body of electrically conductive material may comprise a metal-filled polymer that fills the at least one aperture, and at least partially fills the at least one trench.

The above exemplary embodiments and other embodiments of the inventions are described in the Detailed Description with reference to the Figures. In the Figures, like numerals may reference like elements and descriptions of some elements may not be repeated.

BRIEF DESCRIPTION OF THE DRAWINGS

FIGS. 1-3 show a cross sectional view, a top plan view, and a bottom plan view, respectively, of an exemplary semiconductor die package according to a first invention of the present application.

DETAILED DESCRIPTION OF THE INVENTION

Figure 4:
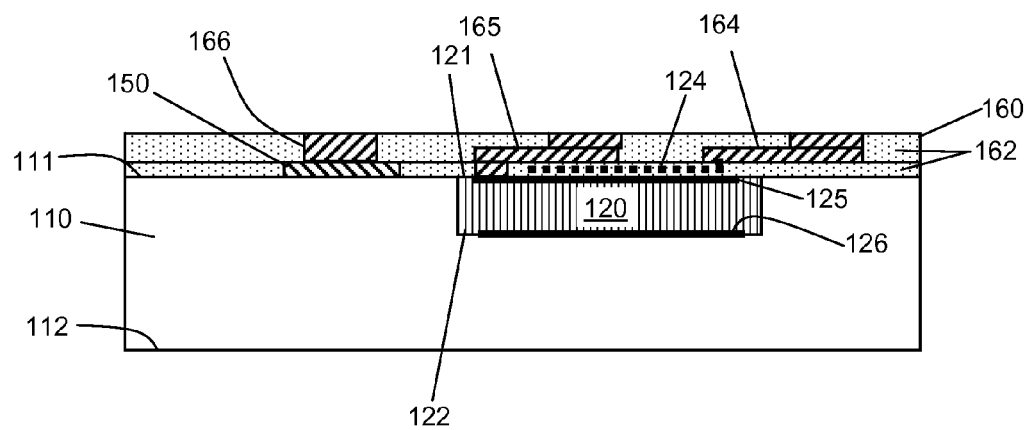
FIGS. 4-8 show cross sectional views of an exemplary semiconductor die during manufacturing by an exemplary method according to the first invention of the present application.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification. The elements may have different interrelationships and different positions for different embodiments.

It will also be understood that when a layer is referred to as being "on" another layer or substrate, it can be directly on the other layer or substrate, or intervening layers may also be present. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

FIG. 1 shows a cross section of an exemplary embodiment 100 of a semiconductor die package in the form of wafer-level chip scale package according to a first invention of the present application. Semiconductor die package 100 comprises a semiconductor die 110 (e.g., semiconductor substrate) having a first surface 111 and a second surface 112 opposite to first surface 111, and a semiconductor device region 120 disposed at the die's first surface 111 and extending toward the die's second surface 112. Semiconductor device region 120 has a first surface 121 disposed at the die's first surface 111, a second surface 122 disposed within die 110, and two or more electrodes disposed on the device region's surfaces. An electrode may comprise a portion of semiconductor 110 (such as a doped region), a conductive layer directly disposed on a surface of semiconductor die or spaced from the surface by a dielectric layer, or other conventional electrode structures known to the semiconductor art. Semiconductor device region 120 may be configured as a rectifier of any type (two electrodes), a transistor of any type (three electrodes), or combination thereof, or any other type of power semiconductor device, or combination thereof.

For the purpose of illustration, and without loss of generality, semiconductor device region 120 is illustrated herein as comprising a vertical MOSFET transistor having a gate electrode 124 and a source electrode 125 disposed at first surface 121 of device region 120, and a drain electrode 126 at a second surface 122 of device region 120. Gate electrode 124 is disposed behind the plane of the figure cross section and is schematically shown by a dashed line. Portions of source and drain electrodes 125-126 lie in the cross section and are schematically shown by respective solid lines. Gate electrode 124 may comprise a conductive layer spaced from a surface of semiconductor die 110 by a dielectric layer, and electrodes 125 and 126 may comprise doped regions of semiconductor die 110. The gate electrode is an example of a control or modulation electrode. The source and drain electrodes are examples of current-conducting electrodes. In general, semiconductor device region 120 comprises the semiconductor material of die and may further comprise doped regions, electrodes, dielectric layers, shallow trenches at first surface 121 (less than 2 microns in depth), and/or other device features to provide the desired device.

Semiconductor die package 100 further comprises a trench 130 disposed at the second surface 112 of semiconductor die 110. Trench 130 has a depth D1 with a surface 131 that abuts drain electrode 126 and that is spaced from first surface 111 of die 110 by at least a distance D2. Semiconductor die package 100 further comprises an aperture 135 disposed in the semiconductor die 110 and extending from a portion of the trench 130 to an electrically conductive region 150 that is disposed at the first surface of the semiconductor die. Aperture 135 has a depth D2 with a surface 136 that abuts surface 131, and exposes a backside portion of conductive region 150. Conductive region 150 may comprise a metal, and may comprise a metal compound, such as titanium silicide ($TiSi_2$) or another metal silicide. An electrically member is disposed on at least a portion of the trench's surface 131, at least a portion of the aperture's surface 136, and at least a portion of the backside of conductive region 150. In one implementation, the electrically conductive member comprises an electrically conductive layer 140 disposed on at least a portion of the surfaces 131 and 136 and conductive region 150. Layer 140 may comprise one or more metals, disposed together and/or in sub-layers. Copper may be used. It may have a thickness in the range of 0.5 microns to 5 microns, or more. Layer 140 electrically couples drain electrode 126 of device 120 with conductive region 150, which is located at the die's first surface 111 along with gate electrode 124 and source electrode 125. This provides all three electrodes of device region 120 at first surface 111, which enables die 110 to be readily placed in a wafer-level chip scale package.

The present invention may be applied to low power devices having relatively low breakdown voltages. These devices typically use shallow electrode trenches (e.g., 0.75 microns deep), and the device region 120 can be made as thin as about 1 micron (with at least 0.25 microns of buffer space below the trenches), and depth D1 may be as deep as the thickness of the die minus 1 micron. That is, the trench depth D1 may reach to a point just below the active device structure in device region 120. The present invention may also be applied to high power device with high and super-high breakdown voltages. These devices typically use deep trenches in the range of several microns to 25 microns (~1 mil). These devices should have significantly larger amounts of buffer space below the trenches to provide mechanical strength against thermal stress, and their device regions 120 are significantly thicker (e.g.., more than 2 mils). Accordingly, an exemplary semiconductor die 110 may have a thickness of 4 mils to 16 mils (~100 to ~406 microns), semiconductor device region 120 may have a thickness (D2) of 0.04 mil to 14 mils (~1 micron to ~350 microns), and trench 130 may have a depth D1 of 3 mils to 15.96 mils (~75 to ~405 microns). The length of trench 130 may be 0.5 millimeters to several millimeters (e.g., 5 to 10 millimeters) in length, and the width of trench may be 0.1 millimeters to 3 millimeters (as measured at second surface 112). Aperture 135 may have a diameter of 100 microns to 1 millimeter (as measured at the bottom surface of trench 130).

As an advantageous effect, conductive layer 140, trench 130, and aperture 135 provide a very low resistance electrical current path between drain electrode 126 and conductive region 150. To further reduce electrical resistance, the electrically conductive member may further comprise a body 145 of an elastic and electrically conductive material disposed on layer 140 and within the remaining space of aperture 135 and at least a portion of the remaining space of trench 130. Conductive material body 145 may comprise a metal-filled polymer, such as silver filled epoxy (e.g., "silver paste"). Conductive material body 145 is preferably more elastic than the material of semiconductor die 110, and more elastic than the material of conductive layer 140, thereby minimizing the stress and strain that it may apply to trench 130 during thermal cycling of the device. Conductive material body 145 may be more elastic than each of the following materials: silicon, copper, aluminum, and gold. With these features of this invention, the on-state resistance can typically be reduced by 30% to 45% over a device that has a semiconductor die of conventional thickness (D1+D2) and a thick backside metal layer. With body 145, conductive layer 140 may have a thickness of 2 microns or less, thereby reducing stress on die 110 while maintaining low on-state resistance.

To provide semiconductor die package 100 in the form of a wafer-level chip scale package, a packaging layer 160 and interconnect bumps 174-176 may be added. Packaging layer 160 comprises electrically insulating dielectric layers 162 and a plurality of electrically conductive redistribution traces 164-166 embedded between the dielectric layers 162. Trace 164 is electrically coupled to gate electrode 124 and gate interconnect bump 174; trace 165 is electrically coupled to source electrode 125 and source interconnect bump 175; and trace 166 is electrically coupled to drain electrode 126 and drain interconnect bump 176. Traces 164-166 perform the task of routing connections from the device electrodes to the locations of the interconnect bumps, which is determined by packaging considerations, thereby "redistributing" the electrode connection points to the requirements of the package. Layer 162 provides an electrically insulating layer for the package surface that is mechanically and thermally durable, and that can withstand the forces and temperatures encountered in mounting the wafer-level chip scale package to an interconnect substrate.

FIG. 2 shows a top plan view of semiconductor die package 100. There are three source bumps 175, two drain bumps 176, and one gate bump 174. Redistribution traces 164 and 165 are shown in dashed lines and they lie below top dielectric layer 162. FIG. 3 shows a bottom plan view of semiconductor die package 100 before conductive layer 140 is disposed on second surface 112 of die 110. Two trenches 130 and two corresponding apertures 135 are shown. The semiconductor device areas 120 are located below drain electrodes 126. There are three mesas 133 interleaved between the two trenches 130. Mesas 133 provide structural stability to semiconductor die 110 and minimize the amount of its warping from the heat generated by the device. Mesas 133 have lengths that are equal to or greater than the lengths of trenches 130, and have typical widths of 0.5 mm to 4 mm. In comparison, a thin semiconductor die without trenches 130 and mesa 133, but having a thickness equal to D2 and a thick backside metal layer (to get the same low resistance of the present invention), would warp significantly from the heat generated by the device. This is due to the mismatch in coefficients of thermal expansion of the metal and semiconductor materials, and the thinness of such a semiconductor die. In addition, the use of elastic conductive material 145 in device 100 enables conductive layer 140 to be made relatively thin, thereby enabling layer 140 to be made thinner to further reduce the stresses and warping caused by the mismatch in the coefficients of thermal expansion of the materials. While elastic conductive material 145 may have a coefficient of thermal expansion (CTE) that is different from that of layer 140 and semiconductor die 110, its low bulk elasticity reduces the amount of stress forces that it can exert on die 110.

In another implementation of package 100, the electrically conductive member may comprise body 145 of elastic electrically conductive material, but not conductive layer 140. In this implementation, body 145 is directly disposed on the surfaces of aperture 135, the back surface of conductive region 150, and at least a portion of the surfaces of trench 130, and fills aperture 135 and at least a portion of the space of trench 130. While this implementation does not provide an on-state resistance that is as low as the implementation that uses both layer 140 and body 145, it can be made by a more simple processing method, and can be suitable for many device applications.

An exemplary method of manufacturing an exemplary semiconductor die package 100 is illustrated with reference to FIGS. 4-8. Referring to FIG. 4, a plurality of device regions 120 are manufactured on a semiconductor wafer, one of which is shown in the figure. The wafer provides the semiconductor die 110 of the device. The device regions 120 may be manufactured to provide any of the above types of power devices, including rectifiers, transistors, other power devices, and/or combinations thereof. Other than having a bottom electrode 126 and one or more top electrodes (124 and/or 125), the particular configuration of device region 120 is not important for practicing this invention of the present application. The manufacturing further comprises forming conductive region 150 at surface 111 of die 110, adjacent to device region 120. Conductive region 150 may comprise a metal layer, a metal silicide layer, a layer of another type of metal compound, or a doped portion of die 110 at surface 111. A metal silicide, such as titanium silicide, may be used. As described below in greater detail, a backside etching process is used to define apertures 135. A difference between the chemical compositions of region 150 and the semiconductor material of die 110 may be used to provide an inherent etch stop that causes the etching process to terminate etching in the vertical direct when the etchant encounters regions 150.

Packaging layer 160 may be formed now or at a later stage by conventional layer deposition and etching actions. For example, a first dielectric layer 162 may be formed on surface 111 and then patterned with apertures that provide connection points to region 150 and electrodes 124-125. Then, a conductive layer may be formed over the first dielectric layer 162 and patterned to provide the lower portions of traces 164-166. Thereafter, a second dielectric layer 162 may be formed over the lower trace portions and the first dielectric layer 162, and patterned to form connection apertures at locations where bumps 174-176 are to be formed. A layer of metal may then be disposed in the connection apertures. A metal lift-off process may be used for this, which may use the same mask used to define the connection apertures. The top portions and other portions of traces 164-166 may comprise copper. At this point, or at a subsequent point in time, the top portions of traces 164-166 may be treated to form a conventional underbump metal finish, which can later facilitate the formation of bumps 174-176 on the traces by a ball drop process. Conventional underbump metal finishes include titanium-nickel-silver (Ti—Ni—Ag), titanium-nickel-copper (Ti—Ni—Cu), titanium-sputtered copper-plated copper (Ti—Cu—Cu), aluminum-nickel-silver (Al—Ni—Ag), as well as others. Currently, an electroless nickel immersion gold process (ENIG) is preferred for a durable finish.

Figure 5:
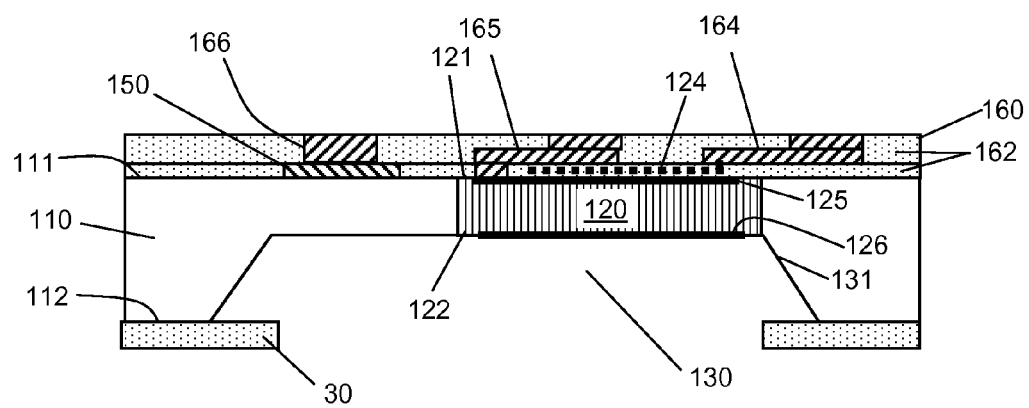

Referring to FIG. 5, the exemplary method further comprises forming trenches 130. This action may comprise masking the top surface of the die, disposing a layer 30 of photoresist on the second surface 112 of die 110, pattern-exposing the photoresist to actinic radiation to define the locations where trenches 130 are to be formed, developing the exposed photoresist layer 30, and thereafter etching the exposed portions of semiconductor die 110 with an etchant. The top surface of the die may be masked by a blanket layer of unexposed positive-tone photoresist or a temporary spin-on wet-etch protection layer, such as a ProTEK coating from Brewer Science. A commercially available wafer-backside aligner and alignment method may be used to align the patterns in photoresist layer 30 for trenches 130 to the device regions 120. Exemplary manufacturers selling such aligners are SUSS MicroTec and EVGroup. Backside alignment methods generally use special alignment marks on the top surface of the wafer (same as first surface 111), which are provided by the equipment manufacturer. An isotropic etchant may be used, such as the conventional combination hydrofluoric acid, nitric acid, and acetic acid (HNA). This etchant can provide an etch rate of 40 to 50 microns per minute. The photoresist layer(s) may then be removed with a photoresist solvent, as is known in the semiconductor processing art. It is also possible to use an anisotropic etchant, such as any conventional dry anisotropic plasma etching process, to do some of the etching to form the trenches. A combination of isotropic etching and anisotropic etching, in any order, may be used to achieve a wide range of aspect ratios of trench depth to trench width, and sidewall slopes. The selection of a particular aspect ratio for the trenches of the device and combinations of etchants are not critical to practicing the invention, and one of ordinary skill in the art may select these features for a particular device design without undue experimentation.

Figure 6:
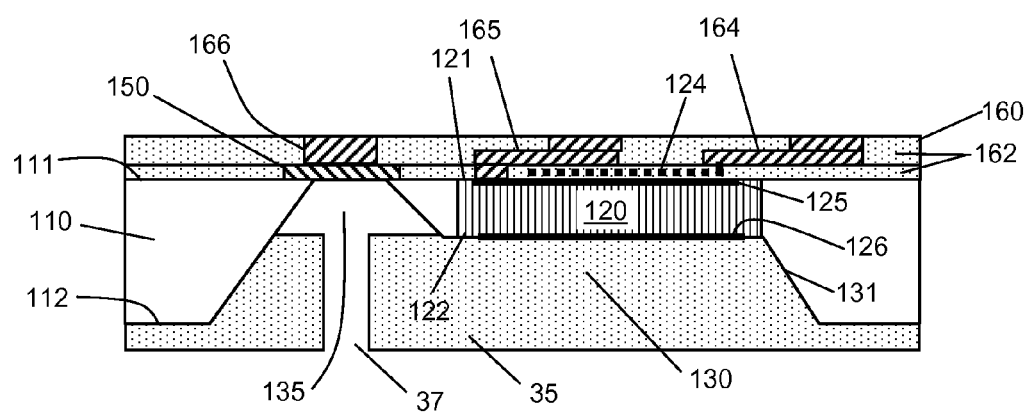

Referring to FIG. 6, the exemplary method further comprises forming apertures 135. This action may comprise masking the first surface 111 of die 110, disposing a thick layer 35 of photoresist on the second surface 112 of die 110, pattern-exposing the photoresist to actinic radiation to define the locations 37 where apertures 135 are to be formed, developing the exposed photoresist layer 35, and thereafter etching the exposed portions of semiconductor die 110 with an etchant. As before, the first surface 111 of die 110 may be masked by a blanket layer of unexposed photoresist or a temporary spin-on wet-etch protection layer, such as a Pro-TEK coating from Brewer Science. A commercially available wafer-backside aligner and alignment method (described above) may be used to align the photoresist pattern to the locations of conductive regions 150 at the top surface of the wafer. The thick photoresist layer 35 fills trenches 130, and is preferably planar with the bottom surface of the wafer (same as second surface 112). Photoresist layer 35 may comprise any conventional thick-layer photoresist system known to the art, and may be exposed by any convention deep via exposure method. Such photoresist systems may comprise a single layer that is commonly used in the MEMS fabrication art, or several sub-layers of photoresist that are separately spun on and soft baked. SUSS MicroTec and EVGroup provide equipment and methods for dispensing and patterning thick photoresist layers, and their products may be used to practice the present invention. Exemplary thick photoresist material are AZ-4999 and AZ-125nXT from AZ Electronic Materials.

An isotropic etchant or an anisotropic etchant may be used to etch apertures 135, preferably one that selectively etches the semiconductor material faster than the material of conductive region 150, so as to provide an etch stop. In the case where semiconductor die 110 comprises silicon and conductive region 150 comprises titanium silicide, the etchant may comprise tetra-methyl ammonium hydroxide (TMAH). As is known in the art, TMAH can be isotropic, anisotropic, or a blend of these characteristics, depending upon concentration and etch temperature. The TMAH etchant may be provided at a concentration (in water) and temperature known to the art that etches silicon at a rate of 1.5 to 5 microns per minute with mainly anisotropic etching behavior (e.g., ~75%) but with some isotropic etching behavior (e.g., ~25%). The partial isotropic behavior rounds the sidewalls of the apertures and trenches, and aids in subsequent steps of disposing conductive layer 140 and conductive body 145. A sidewall slope of 60 degrees ±20 degrees (as measured from horizontal) for apertures 135 is suitable for disposing layer 140 and/or body 145, and may be achieved with the above noted 75%/25% mix of anisotropic and isotropic etching behaviors. It is also possible to use a conventional anisotropic dry plasma etching process to do some of the etching to form the apertures. A combination of isotropic etching and anisotropic etching, in any order, may be used to achieve a wide range of aspect ratios of aperture depth to aperture width, and sidewall slopes. After etching, the photoresist layers may then be removed with a photoresist solvent.

Figure 7:
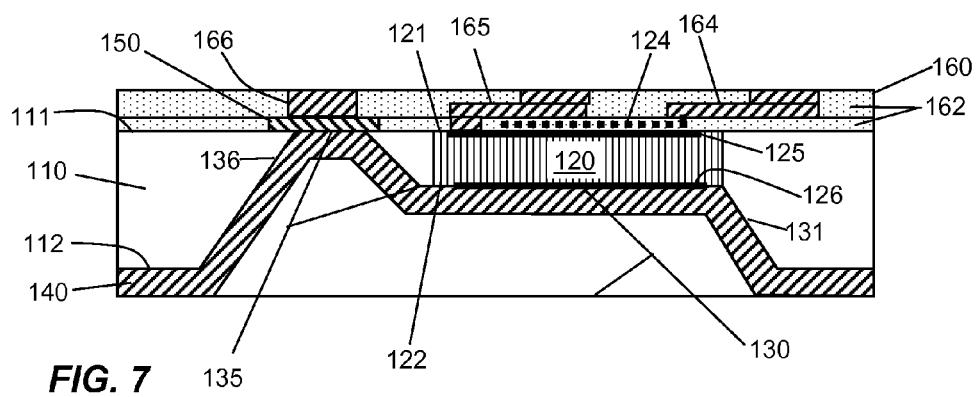

Referring to FIG. 7, a layer 140 of conductive material, such as one or more sub-layers of metal, may be formed over the surfaces of trenches 130, apertures 135, and the remaining portions of the bottom surface of the wafer (same as second surface 112). Any conventional formation process may be used, such as sputtering, evaporation followed by electroplating, etc. To provide better adhesion for conductive layer 140, the surfaces of trenches 130, apertures 135, and the wafer's bottom surface may be roughened by exposing these surfaces to an etchant prior to forming conductive layer 140. For a silicon wafer, a brief etch in TMAH may be used (in less time than needed to etch trench 130 or aperture 135). The outermost sub-layer of conductive layer 140 may comprise copper, and the cooper sub-layer may be processed with the above-described underbump metal process or electroless nickel immersion gold process (ENIG) for a durable finish. (Layer 140 and the exposed portions of traces 164-166 may be so processed at the same time.)

Figure 8:
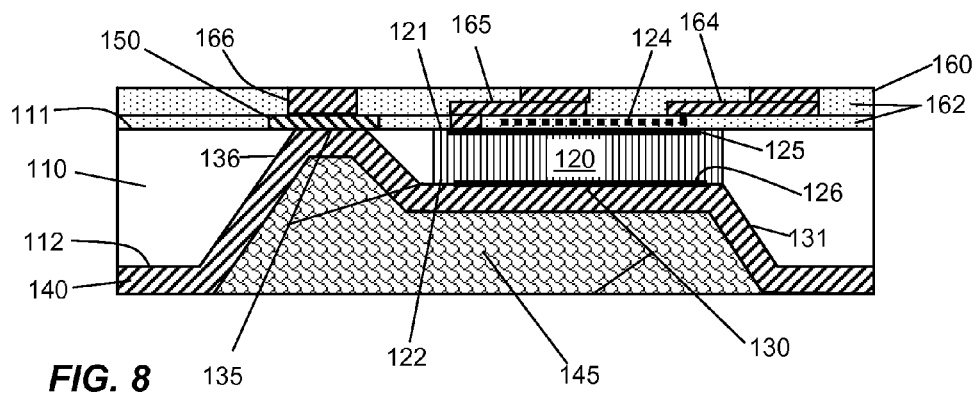

As an optional action for another implementation of package 100, a body 145 of conductive material may be disposed on layer 140 in the remaining portions of trenches 130 and apertures 135, as illustrated by FIG. 8. Body 145 may comprise a silver paste, and may be disposed by spin coating, followed by curing. As an optional action, a planarizing etch back process may be performed to remove portions of silver paste that are formed on second surface 112 of the device. The DFS8910 surface planer manufactured by DISCO Corporation may be used. This equipment uses a diamond bit to provide high-precision planarization. The planarization exposes portions of layer 140, which can be marked with package information by laser marking. It also ensures that the package's back surface can be stably mounted to a leadframe, interconnect substrate, or the like. If needed, the above-described underbump metal process or ENIG process may be repeated after the planarization process, and prior to marking.

Referring back to FIG. 1, interconnect bumps 174-176 may be disposed on the top portion of traces 164-166 by any conventional bump deposition process. Prior to bump deposition, the top portions of traces 164-166 may be treated with an underbump metal process or an electroless nickel immersion gold process (ENIG), as described above, if they were not previously so treated. For this, the traces 164-166 preferably comprise copper. The complete die packages may then be separated by dicing or the like.

Another method embodiment according to the invention comprises the above-described method without disposing conductive layer 140, but with disposing body 145 directly on the semiconductor back surface, in trenches 130 and apertures 135, and on conductive region 150. A slightly higher on-state resistance may occur, but manufacturing effort and costs are reduced. Body 145 may be planarized, as described above. Prior to disposing body 145, the surfaces of trenches 130, apertures 135, and the wafer's bottom surface may be roughened by exposing these surfaces to an etchant to provide better adhesion for conductive body 145. For a silicon wafer, a brief etch in TMAH may be used (in less time than needed to etch trench 130 or aperture 135).

It should be understood that where the performance of an action (such as the underbump metal or ENIG process) of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action precedes or follows another action).

Figure 9:
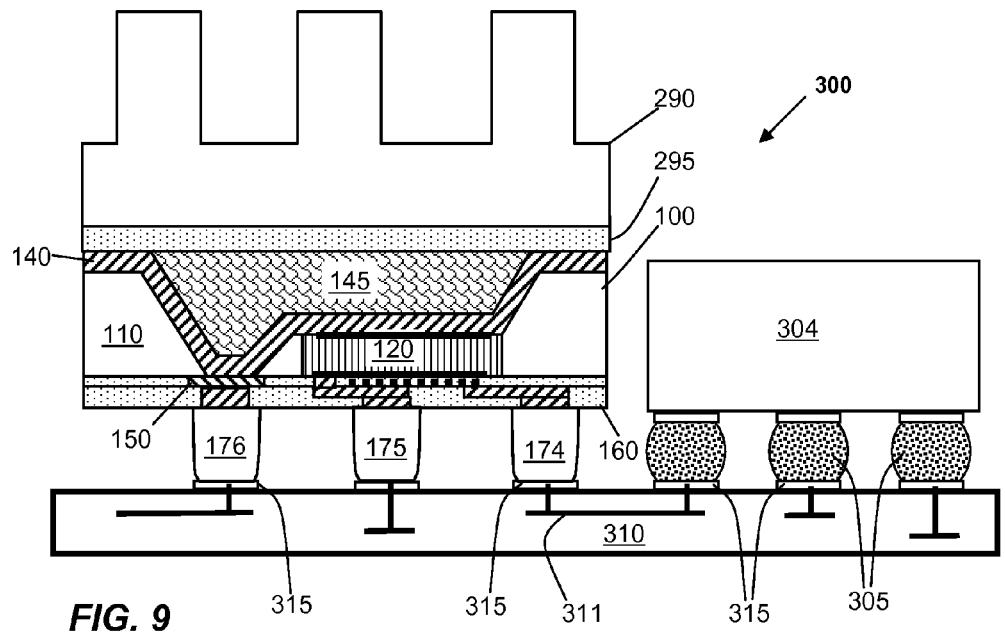
FIG. 9 shows a side view of an exemplary system according to the present invention.

FIG. 9 is a side view of an exemplary system 300 that comprises an interconnect substrate 310 having a plurality of electrical interconnect pads 315, and package 100 disposed on the top surface interconnect board 310. The conductive bodies 174-176 of package 100 are electrically coupled to respective pads 315. System 300 also comprises an electrical package 304 that is electrically coupled to respective pads 315 of interconnect substrate 310 by respective adhesive bodies 305. Package 304 may comprise a passive electronic component, or may comprise a package having the same construction as package 100, or a different construction, and may be electrically coupled to package 100 by one or more electrical traces 311 disposed in or on interconnect substrate 310. A heatsink 290 may be attached to package 100 by a layer of thermally conductive adhesive 295.

The semiconductor die packages described above can be used in electrical assemblies including circuit boards with the packages mounted thereon. They may also be used in systems such as power controllers, power supplies, computers, etc.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A semiconductor die comprising:
   a first surface and a second surface opposite to the first surface;
   an electrically conductive region disposed at the first surface of the semiconductor die;
   a trench disposed at the second surface of the semiconductor die, the trench having a surface that is spaced from the first surface by at least a first distance;
   a semiconductor device region disposed between the die's first surface and the trench;
   an aperture disposed in the semiconductor die and extending from at least a portion of the trench to the conductive region, the aperture having a surface and exposing a backside portion of the conductive region; and
   an electrically conductive member disposed on at least a portion of the trench's surface, at least a portion of the aperture's surface, and the backside portion of the conductive region.

2. The semiconductor die of claim 1, wherein the conductive region comprises a metallic element.

3. The semiconductor die of claim 1, wherein the conductive region comprises a metal silicide.

4. The semiconductor die of claim 1, wherein the electrically conductive member comprises:
   an electrically conductive layer disposed on at least a portion of the trench's surface, at least a portion of the aperture's surface, and the backside portion of the conductive region, and
   a body of conductive material disposed on the conductive layer in the trench and the aperture and electrically coupled to the conductive layer.

5. The semiconductor die of claim 4, wherein the body of conductive material has a greater elasticity than the material of the semiconductor die.

6. The semiconductor die of claim 4, wherein the body of conductive material has a greater elasticity than the material of the conductive layer.

7. The semiconductor die of claim 4, wherein the body of conductive material comprises a silver-filled polymer.

8. The semiconductor die of claim 4, wherein the conductive layer has a thickness of five microns or less.

9. The semiconductor die of claim 1, wherein the electrically conductive member comprises a body of conductive material disposed on at least a portion of the trench's surface, at least a portion of the aperture's surface, and the backside portion of the conductive region.

10. The semiconductor die of claim 9, wherein the body of conductive material has a greater elasticity than the material of the semiconductor die.

11. The semiconductor die of claim 9, wherein the body of conductive material comprises a silver-filled polymer.

12. The semiconductor die of claim 1, wherein the die has a thickness in the range of about 4 mils to about 16 mils, and wherein the trench has a depth in the range of about 3 mils to about 15.96 mils.

13. A semiconductor die package comprising a semiconductor die of claim 1, and a packaging layer disposed at the first surface of the semiconductor die, the packaging layer comprising at least one dielectric layer and a plurality of conductive traces.

14. A system comprising an interconnect substrate and the semiconductor die package of claim 13 attached to the interconnect substrate.

15. A method of manufacturing a semiconductor die comprising:
   forming an electrically conductive region at a first surface of a semiconductor die adjacent to a semiconductor device region, the semiconductor device region extending from the first surface of the semiconductor die to a second surface of the semiconductor die, the second surface being opposite to the first surface, the semiconductor device region having a first electrode closer to the first surface than the second surface, and a second electrode disposed between the first electrode and the second surface;
   forming at least one trench at the second surface of the semiconductor die, the trench extending toward the conductive region and the second electrode of the semiconductor device region;
   forming at least one aperture in the semiconductor die, the at least one aperture extending from a portion of the at least one trench to the conductive region; and
   disposing an electrically conductive member to cover at least a portion of the trench's surface, at least a portion of the aperture's surface, and the backside portion of the conductive region.

16. The method of claim 15, wherein disposing the electrically conductive member comprises forming a layer of electrically conductive material over surfaces of the at least one trench, the at least one aperture, and the conductive region.

17. The method of claim 16, wherein forming the layer of conductive material comprises exposing the at least one trench and the at least one aperture to an etchant, and depositing conductive material on the etched surfaces of the at least one trench and the at least one aperture.

18. The method of claim 16, further comprising disposing a body of conductive material on the conductive layer in the areas of the at least one trench and at least one aperture.

19. The method of claim 15, wherein disposing the electrically conductive member comprises disposing a body of electrically conductive material on the at least one trench, the at least one aperture, and the conductive region.

20. The method of claim 15, wherein forming the conductive region comprises forming a layer of metal silicide.

21. The method of claim 15, wherein forming the at least one trench comprises exposing the die's second surface to an isotropic etchant through a patterned mask.

22. The method of claim 15, wherein forming the at least one aperture comprises exposing the die's second surface to an etchant through a patterned mask, the etchant having at least some anisotropic behavior.

23. The method of claim 15, further comprising forming a packaging layer on the first surface of the semiconductor die, the packaging layer comprising at least one dielectric layer and a plurality of conductive traces.

24. The method of claim 15, further comprising manufacturing the device region.

25. A semiconductor die comprising:
   a first surface and a second surface opposite to the first surface;
   an electrically conductive region disposed at the first surface of the semiconductor die;
   a trench disposed at the second surface of the semiconductor die, the trench having a surface that is spaced from the first surface by at least a first distance;
   an aperture disposed in the semiconductor die and extending from at least a portion of the trench to the conductive region, the aperture having a surface and exposing a backside portion of the conductive region; and
   an electrically conductive member disposed on at least a portion of the trench's surface, at least a portion of the aperture's surface, and the backside portion of the conductive region, the electrically conductive member comprising an electrically conductive layer disposed on at least a portion of the trench's surface, at least a portion of the aperture's surface, and the backside portion of the conductive region, and further comprising a body of conductive material disposed on the conductive layer in the trench and the aperture and electrically coupled to the conductive layer.

26. The semiconductor die of claim 25, wherein the body of conductive material has a greater elasticity than the material of the semiconductor die.

27. The semiconductor die of claim 25, wherein the body of conductive material has a greater elasticity than the material of the conductive layer.

28. The semiconductor die of claim 25, wherein the body of conductive material comprises a silver-filled polymer.

29. The semiconductor die of claim 25, wherein the conductive layer has a thickness of five microns or less.

30. A semiconductor die comprising:
   a first surface and a second surface opposite to the first surface;
   an electrically conductive region disposed at the first surface of the semiconductor die;
   a trench disposed at the second surface of the semiconductor die, the trench having a surface that is spaced from the first surface by at least a first distance;
   an aperture disposed in the semiconductor die and extending from at least a portion of the trench to the conductive region, the aperture having a surface and exposing a backside portion of the conductive region; and
   an electrically conductive member disposed on at least a portion of the trench's surface, at least a portion of the aperture's surface, and the backside portion of the conductive region, the electrically conductive member comprising a body of conductive material disposed on at least a portion of the trench's surface, at least a portion of the aperture's surface, and the backside portion of the conductive region.

31. The semiconductor die of claim 30, wherein the body of conductive material has a greater elasticity than the material of the semiconductor die.

32. The semiconductor die of claim 30, wherein the body of conductive material comprises a silver-filled polymer.

33. A semiconductor die comprising:
- a first surface and a second surface opposite to the first surface;
- an electrically conductive region disposed at the first surface of the semiconductor die;
- a trench disposed at the second surface of the semiconductor die, the trench having a surface that is spaced from the first surface by at least a first distance;
- an aperture disposed in the semiconductor die and extending from at least a portion of the trench to the conductive region, the aperture having a surface and exposing a backside portion of the conductive region; and
- an electrically conductive member disposed on at least a portion of the trench's surface, at least a portion of the aperture's surface, and the backside portion of the conductive region; and
- wherein the die has a thickness in the range of about 4 mils to about 16 mils, and wherein the trench has a depth in the range of about 3 mils to about 15.96 mils.

* * * * *